US012620829B2

(12) United States Patent
Sudo

(10) Patent No.: US 12,620,829 B2
(45) Date of Patent: May 5, 2026

(54) CIRCUIT DEVICE AND REAL-TIME CLOCK DEVICE

(71) Applicant: SEIKO EPSON CORPORATION, Tokyo (JP)

(72) Inventor: Yasuhiro Sudo, Chino (JP)

(73) Assignee: SEIKO EPSON CORPORATION (JP)

( * ) Notice: Subject to any disclaimer, the term of this patent is extended or adjusted under 35 U.S.C. 154(b) by 0 days.

(21) Appl. No.: 18/897,120

(22) Filed: Sep. 26, 2024

(65) Prior Publication Data

US 2025/0105658 A1      Mar. 27, 2025

(30) Foreign Application Priority Data

Sep. 27, 2023     (JP) ................................. 2023-164648

(51) Int. Cl.
| | |
|---|---|
| *H02J 9/06* | (2006.01) |
| *G01R 31/3835* | (2019.01) |
| *G06F 1/14* | (2006.01) |
| *H02J 7/34* | (2006.01) |
| *H02J 7/80* | (2026.01) |

(52) U.S. Cl.
CPC ........... *H02J 9/06* (2013.01); *G01R 31/3835* (2019.01); *G06F 1/14* (2013.01); *H02J 7/342* (2020.01); *H02J 7/80* (2026.01)

(58) Field of Classification Search
CPC . H02J 9/06; H02J 7/0047; H02J 7/342; G01R 31/3835; G06F 1/14
See application file for complete search history.

(56) References Cited

U.S. PATENT DOCUMENTS

2014/0008984 A1     1/2014   Kamiyama et al.
2024/0313765 A1*    9/2024   Akashi ............. H03K 17/08104

FOREIGN PATENT DOCUMENTS

JP          2014-017965 A      1/2014

* cited by examiner

*Primary Examiner* — Jeffrey M Shin
(74) *Attorney, Agent, or Firm* — Harness, Dickey & Pierce, P.L.C.

(57) ABSTRACT

A circuit device includes a main power supply terminal, a backup power supply terminal, a voltage detection circuit, a register section, a processing circuit, and a power supply control circuit. A main power supply voltage is supplied through the main power supply terminal. A backup power supply voltage from a backup element is supplied through the backup power supply terminal. The voltage detection circuit detects the backup power supply voltage and outputs backup voltage data corresponding to the backup power supply voltage. Threshold voltage data is stored in the register section. The processing circuit compares the backup voltage data with the threshold voltage data. The power supply control circuit performs charging control on the backup element for charging with the main power supply voltage on the basis of the result of a comparison made by the processing circuit.

12 Claims, 10 Drawing Sheets

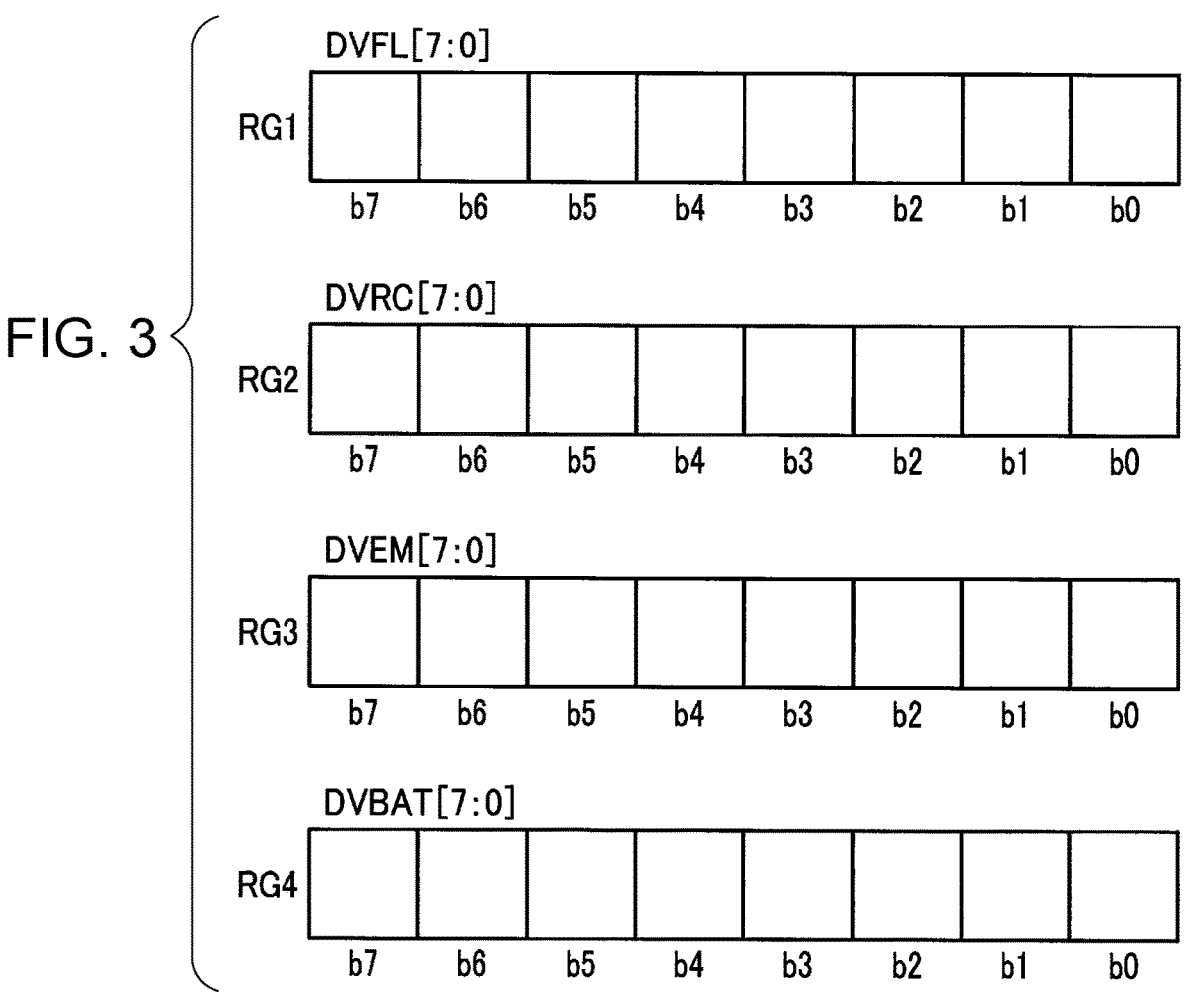
FIG. 3
DVFL[7:0]
RG1
| b7 | b6 | b5 | b4 | b3 | b2 | b1 | b0 |
DVRC[7:0]
RG2
| b7 | b6 | b5 | b4 | b3 | b2 | b1 | b0 |
DVEM[7:0]
RG3
| b7 | b6 | b5 | b4 | b3 | b2 | b1 | b0 |
DVBAT[7:0]
RG4
| b7 | b6 | b5 | b4 | b3 | b2 | b1 | b0 |
FIG. 4
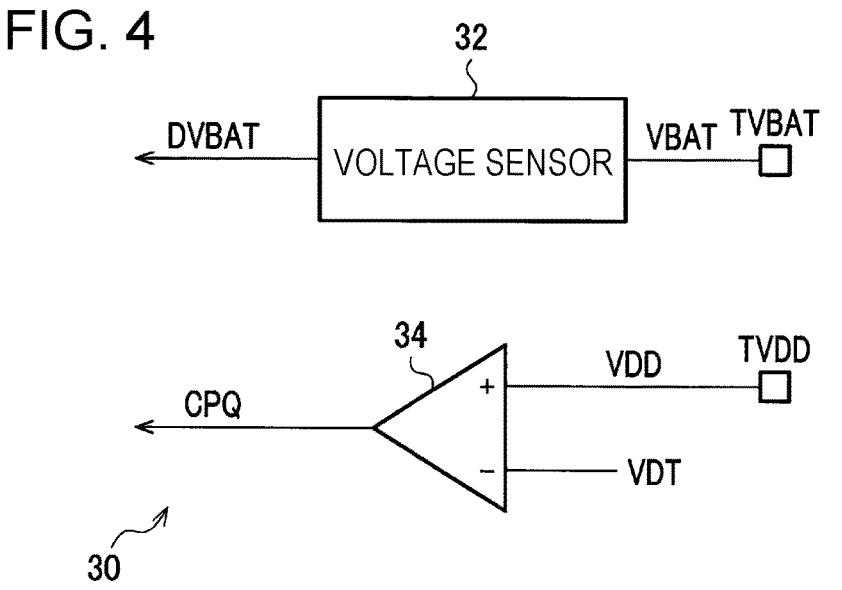

CIRCUIT DEVICE AND REAL-TIME CLOCK DEVICE

The present application is based on, and claims priority from JP Application Serial Number 2023-164648, filed Sep. 27, 2023, the disclosure of which is hereby incorporated by reference herein in its entirety.

BACKGROUND

1. Technical Field

The present disclosure relates to circuit devices, real-time clock devices, and the like.

2. Related Art

A real-time clock device disclosed in JP-A-2014-017965, which is an example of the related art, detects voltage by intermittently turning on a switch disposed between a main power supply terminal and a backup power supply terminal. Accordingly, the real-time clock device enables switching between a main power supply and a backup power supply. Backup elements supplied with backup power supply voltage are charged with the main power supply in accordance with the results of voltage detection.

The technique disclosed in JP-A-2014-017965 involves the use of comparator circuits that compare the backup power supply voltage with a fixed value of reference voltage to detect voltage. In such a case, it is difficult to perform flexible charging control on various backup elements.

SUMMARY

An aspect of the present disclosure relates to a circuit device that includes a main power supply terminal, a backup power supply terminal, a voltage detection circuit, a register section, a processing circuit, and a power supply control circuit. A main power supply voltage is supplied through the main power supply terminal. A backup power supply voltage from a backup element is supplied through the backup power supply terminal. The voltage detection circuit detects the backup power supply voltage and outputs backup voltage data corresponding to the backup power supply voltage. Threshold voltage data for comparison with the backup voltage data is stored in the register section. The processing circuit compares the backup voltage data with the threshold voltage data. The power supply control circuit performs charging control on the backup element for charging with the main power supply voltage on the basis of the result of a comparison made by the processing circuit.

Another aspect of the present disclosure relates to a real-time clock device that includes the circuit device described above and a resonator. The circuit device includes an oscillation circuit and a time measurement circuit. The oscillation circuit generates a clock signal by causing the resonator to oscillate. The time measurement circuit performs time measurement processing based on the clock signal.

BRIEF DESCRIPTION OF THE DRAWINGS

FIG. 3 illustrates examples of registers included in a register section.
FIG. 4 illustrates an example configuration of a voltage detection circuit.

DESCRIPTION OF EMBODIMENTS

The following describes an embodiment of the present disclosure. It should be noted that the embodiment described below does not unduly limit the scope of what is hereinafter claimed. Furthermore, not all of the features described in the following embodiment are essential features of the present disclosure.

1. Circuit Device and Real-Time Clock Device

Figure 1:
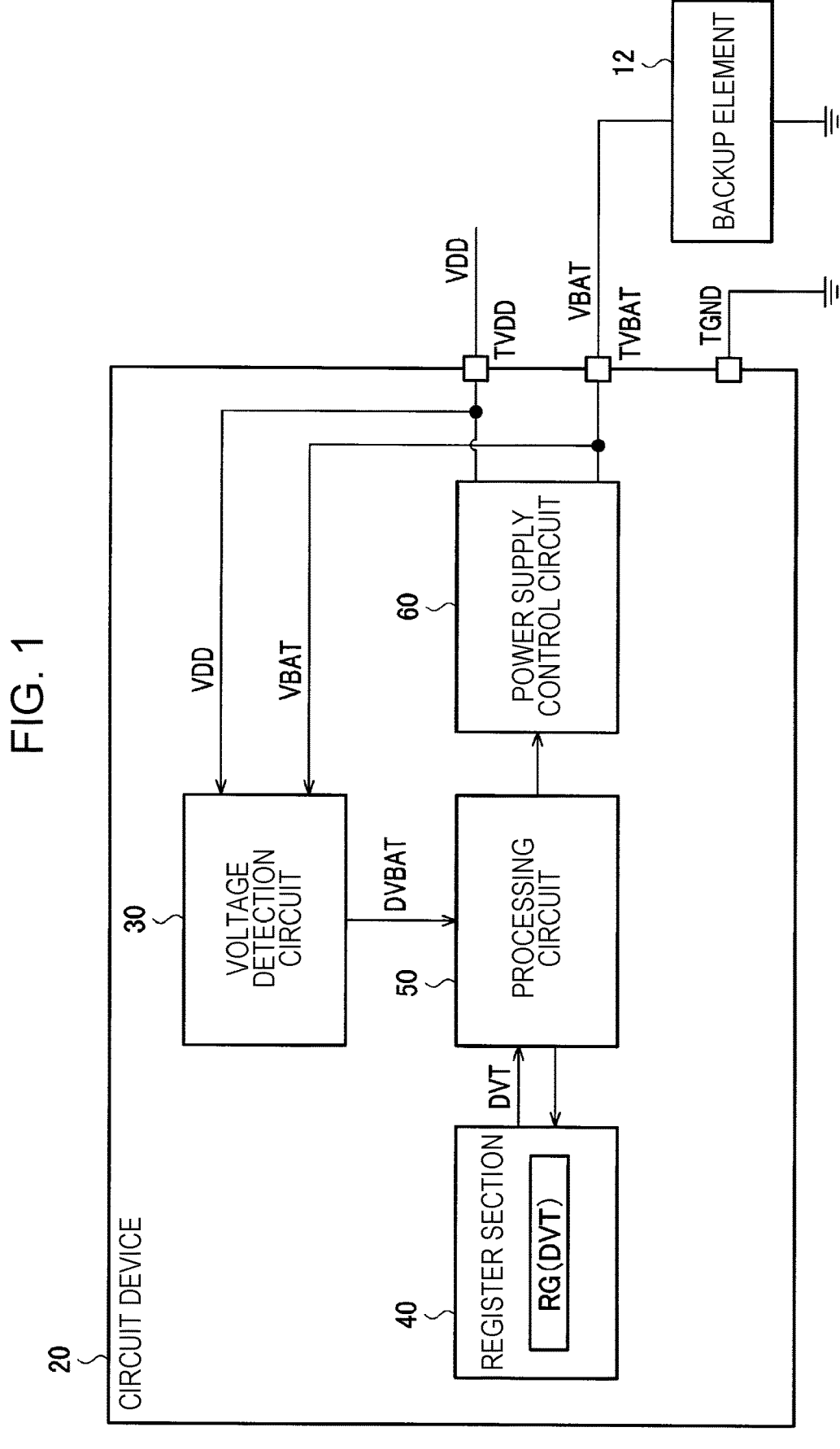
FIG. 1 illustrates an example configuration of a circuit device according to an embodiment.

FIG. 1 illustrates an example configuration of a circuit device 20 according to an embodiment. The circuit device 20 includes a voltage detection circuit 30, a register section 40, a processing circuit 50, a power supply control circuit 60, a main power supply terminal TVDD, and a backup power supply terminal TVBAT. The circuit device 20 may include a ground terminal TGND. For example, the circuit device 20 is an integrated circuit (IC) formed in a semiconductor process. Specifically, the circuit device 20 is a semiconductor chip including a semiconductor substrate and circuit elements formed on the semiconductor substrate. The circuit device 20 may be regarded as a semiconductor device including a semiconductor chip mounted in a package. The configuration of the circuit device 20 according to the present embodiment is not limited to the one illustrated in FIG. 1. A wide range of variations can be devised by omitting some of the constituent components, adding another component, and/or replacing some of the constituent components with other components. In the present embodiment, the word "connected" is used to refer to electrical connection. The electrical connection is a connection that allows the transmission of electrical signals and, by extension, the transmission of information by electrical signals. The electrical connection may refer to a state in which one component is connected to another component with, for example, a passive element disposed therebetween.

The main power supply terminal TVDD is a terminal through which a main power supply voltage VDD is supplied. The main power supply voltage VDD is, for example, the power supply voltage on the high-potential side and is supplied by, for example, an external power unit. The backup power supply terminal TVBAT is a terminal through which a backup power supply voltage VBAT from a backup element 12 is supplied. The backup power supply voltage VBAT is, for example, the power supply voltage from the backup element 12 in which electricity is stored. The ground terminal TGND is a terminal through which the ground voltage, namely, GND is supplied. GND is also referred to as VSS. For example, the ground voltage is the ground potential. The terminals respectively denoted by TVDD, TVBAT, and TGND are, for example, pads of the circuit device 20. For example, the pads are provided in pad regions where a metal layer under a passivation film is exposed. That is, the metal layer exposed in the pad regions serves as the pads that are terminals of the circuit device 20.

The backup element 12 holds the backup power supply voltage VBAT. The backup element 12 is, for example, a secondary battery or a supercapacitor. Alternatively, the backup element 12 may be a primary battery. Examples of the secondary battery include lithium-ion batteries, lithium metal batteries, nickel-cadmium batteries, sodium-ion batteries, lead-acid batteries, all-solid-state batteries, and semi-solid-state batteries. Supercapacitors are also called high-capacitance capacitors. Examples of such a supercapacitor include electric double layer capacitors (EDLCs), pseudo-capacitors, and hybrid capacitors.

The voltage detection circuit 30 is a circuit that detects voltage. Referring to FIG. 1, the voltage detection circuit 30 detects the backup power supply voltage VBAT. The voltage detection circuit 30 then outputs backup voltage data DVBAT, which corresponds to the backup power supply voltage VBAT. The Backup voltage data DVBAT is digital data representing the analog voltage value of the backup power supply voltage VBAT. The voltage detection circuit 30 can also detect the main power supply voltage VDD.

The register section 40 is the location of storage of various kinds of information. The register section 40 may be regarded as a storage circuit. The register section 40 includes multiple registers. The register section 40 may be implemented by, for example, a flip-flop circuit or memory such as RAM. Referring to FIG. 1, threshold voltage data DVT for comparison with the backup voltage data DVBAT is stored in the register section 40. For example, the threshold voltage data DVT is stored in registers RG included in the register section 40. The register section 40 is the location of storage of different kinds of the threshold voltage data DVT for comparison with different kinds of voltage. Each of the different kinds of threshold voltage data DVT is stored in the corresponding one of the registers included in the register section 40. The threshold voltage data DVT represents the threshold voltage for comparison with the backup power supply voltage VBAT represented by the backup voltage data DVBAT.

The processing circuit 50 performs various kinds of processing. The processing circuit 50 can be implemented by an application-specific integrated circuit (ASIC) such as a gate array with automatic placement and routing or by a processor such as a CPU in a microcomputer. Referring to FIG. 1, the processing circuit 50 compares the backup voltage data DVBAT with the threshold voltage data DVT. The processing circuit 50 then performs comparison processing to determine whether the backup voltage data DVBAT is above the threshold voltage data DVT or whether the backup voltage data DVBAT is below the threshold voltage data DVT. The comparison processing in which the backup voltage data DVBAT is compared with the threshold voltage data DVT may be equated with comparison of the backup power supply voltage VBAT represented by the backup voltage data DVBAT and the threshold voltage represented by the threshold voltage data DVT.

The power supply control circuit 60 performs various kinds of power supply control, such as switching control for power supply voltage. The power supply control circuit 60 may also be regarded as a power supply switching control circuit or a charging control circuit. Referring to FIG. 1, the power supply control circuit 60 performs charging control on the backup element 12 for charging with the main power supply voltage VDD on the basis of the result of a comparison made by the processing circuit 50. For example, the processing circuit 50 outputs the result of a comparison of the backup voltage data DVBAT and the threshold voltage data DVT. This may, for example, be the result of a comparison made to determine whether the backup voltage data DVBAT is above the threshold voltage data DVT or whether the backup voltage data DVBAT is below the threshold voltage data DVT. The power supply control circuit 60 may, for example, perform charging control on the backup element 12 for charging with the main power supply voltage VDD on the basis of the result of the comparison. The power supply control circuit 60 may, for example, perform control on the basis of the result of the comparison made by the processing circuit 50. Specifically, the power supply control circuit 60 may perform control so that the main power supply terminal TVDD and the backup power supply terminal TVBAT are electrically connected to each other, in which case the backup element 12 is charged with the main power supply voltage VDD. Alternatively, the power supply control circuit 60 may perform control so that the main power supply terminal TVDD and the backup power supply terminal TVBAT are electrically disconnected from each other, in which case the backup element 12 stops being charged with the main power supply voltage VDD.

As described above, the circuit device 20 according to the present embodiment includes the main power supply terminal TVDD, the backup power supply terminal TVBAT, the voltage detection circuit 30, the register section 40, the processing circuit 50, and the power supply control circuit 60. The voltage detection circuit 30 detects the backup power supply voltage VBAT and then outputs the backup voltage data DVBAT. The register section 40 is the location of storage of the threshold voltage data DVT. The processing circuit 50 compares the backup voltage data DVBAT with the threshold voltage data DVT. The power supply control circuit 60 performs charging control on the backup element 12 for charging with the main power supply voltage VDD on the basis of the result of the comparison made by the processing circuit 50. In this way, the charging control can be performed on the backup element 12 on the basis of the result of the comparison of the threshold voltage data DVT stored in the register section 40 and the backup voltage data DVBAT obtained from the voltage detection circuit 30 that detects the backup power supply voltage VBAT. The charging control performed on the backup element 12 may, for example, be based on comparison of the backup voltage data DVBAT and a variable value that is stored in the register section 40 as the threshold voltage data DVT. Accordingly, flexible charging control can be performed on the backup element 12. For example, multiple values of the threshold voltage data DVT may be stored in the register section 40 to enable flexible threshold settings for the charging control. Thus, various elements can be adopted as the backup element 12.

Meanwhile, the technique disclosed in JP-A-2014-017965 involves the use of comparator circuits that compare the backup power supply voltage with a fixed value of reference voltage. On the downside, the conventional technique necessitates a number of comparator circuits including a first comparator circuit for comparing the backup power supply voltage with a threshold voltage for full charge detection, a second comparator circuit for comparing the backup power supply voltage with a threshold voltage for recharge detection, and a third comparator circuit for comparing the backup power supply voltage with a threshold voltage for voltage drop detection. This leads to an increase in the size of circuitry.

Different threshold values for the full charge detection or the recharge detection are used for different types of elements that are adoptable as the backup element 12, examples of which include lithium-ion batteries, lithium metal batteries, nickel-cadmium batteries, sodium-ion batteries, all-solid-state batteries, and semi-solid-state batteries. For example, the threshold voltage for detecting the fully charged state of lithium-ion batteries is typically about 3 V, whereas the threshold voltage for detecting the fully charged state of supercapacitors is typically about 2.7 V. It is therefore difficult to adopt various types of backup elements 12 by using the conventional technique such as the one disclosed in JP-A-2014-017965 that involves the use of comparator circuits that compare the backup power supply voltage with a fixed value of reference voltage.

As a workaround, the charging control performed on the backup element 12 in the present embodiment involves the storage of the threshold voltage data DVT in the register section 40 and digital processing in which the processing circuit 50 compares the backup voltage data DVBAT with the threshold voltage data DVT stored in the register section 40. Unlike the conventional technique, the present embodiment does not require a number of analog comparator circuits. Thus, the circuitry of the circuit device 20 in the present embodiment can be made much smaller than the circuitry of the circuit device based on the conventional technique. In the present embodiment, the threshold voltage data DVT for each type of backup elements 12 is stored in numerical form in the register section 40 so that the charging control for each type of backup elements 12 can be performed on the basis of comparison of the threshold voltage data DVT and the backup voltage data DVBAT. Accordingly, flexible charging control can be performed on various types of backup elements 12.

Figure 2:
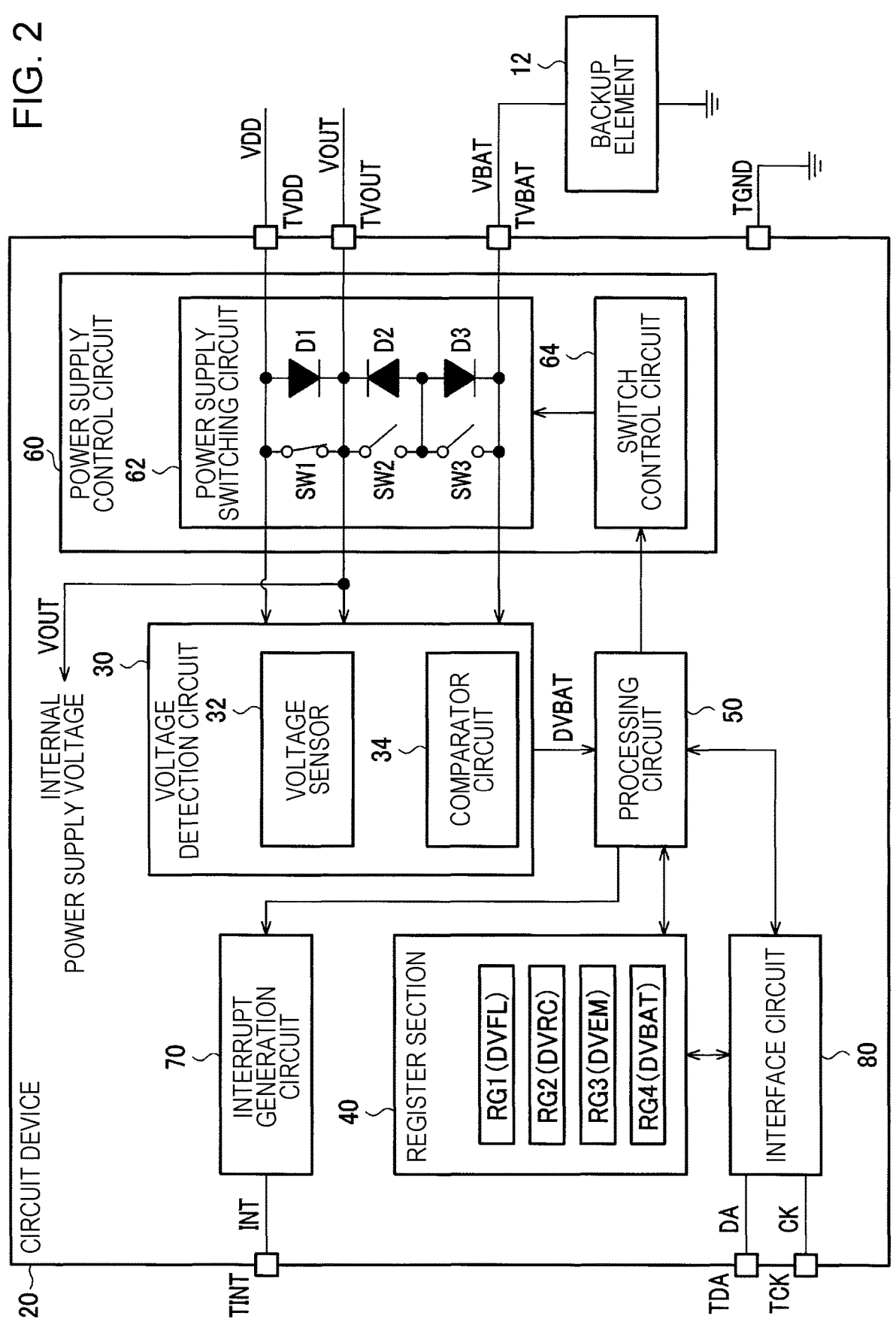
FIG. 2 illustrates the example configuration of the circuit device according to the embodiment in greater detail.

FIG. 2 illustrates the example configuration of the circuit device 20 according to the present embodiment in greater detail. Referring to FIG. 2, the circuit device 20 includes, in addition to the components illustrated in FIG. 1, an interrupt generation circuit 70, an interface circuit 80, and a power supply voltage output terminal TVOUT. FIG. 2 also illustrates detailed example configurations of the voltage detection circuit 30, the register section 40, and the power supply control circuit 60 in greater detail. The configuration of the circuit device 20 according to the present embodiment is not limited to the one illustrated in FIG. 2. A wide range of variations can be devised by omitting some of the constituent components, adding another component, and/or replacing some of the constituent components with other components.

The power supply control circuit 60 includes a power supply switching circuit 62 and a switch control circuit 64. The power supply switching circuit 62 includes a switch SW1, a switch SW2, and a switch SW3. The switches SW1, SW2, and SW3 are connected in parallel with the respective diodes, which are denoted by D1, D2, and D3. The switches SW1, SW2, and SW3 enable switching between power supply connections. The diodes D1, D2, and D3 are intended for, for example, the prevention of backflow of power. The switch control circuit 64 outputs control signals for on-off control of the switches SW1, SW2, and SW3 on the basis of the result of the comparison made by the processing circuit 50. The power supply switching circuit 62 controls switching between power supply connections for, for example, charging control on the basis of the control signals from the switch control circuit 64. Specifically, the on-off control of the switches SW1, SW2, and SW3 is performed on the basis of the control signals from the switch control circuit 64 to enable switching between power supply connections for, for example, charging control.

One end of the switch SW1 is connected to the main power supply terminal TVDD, and the other end of the switch SW1 is connected to the power supply voltage output terminal TVOUT. The anode of the diode D1 is connected to the main power supply terminal TVDD, and the cathode of the diode D1 is connected to the power supply voltage output terminal TVOUT. The forward direction of the diode D1 points from the main power supply terminal TVDD to the power supply voltage output terminal TVOUT.

One end of the switch SW2 is connected to the power supply voltage output terminal TVOUT, and the other end of the switch SW2 is connected to a connection node at which the diode D2 and the diode D3 are connected to each other. The anode of the diode D2 is connected to the connection node at which the diode D2 and the diode D3 are connected to each other. The cathode of the diode D2 is connected to the power supply voltage output terminal TVOUT. The forward direction of the diode D2 points from the connection node to the power supply voltage output terminal TVOUT.

One end of the switch SW3 is connected to the connection node at which the diode D2 and the diode D3 are connected to each other. The other end of the switch SW3 is connected to the backup power supply terminal TVBAT. The anode of the diode D3 is connected to the connection node at which the diode D2 and the diode D3 are connected to each other. The cathode of the diode D3 is connected to the backup power supply terminal TVBAT. The forward direction of the diode D3 points from the connection node to the backup power supply terminal TVBAT.

The switches SW1, SW2, and SW3 may, for example, be MOS transistors. The diodes D1, D2, and D3 may, for example, be parasitic diodes of transistors. For example, the switches SW1, SW2, and SW3 are p-type transistors, which may be referred to as a first transistor, a second transistor, and a third transistor, respectively. In this case, each of the diodes D1, D2, and D3 may be a parasitic diode between the source and the back gate or between the drain and the back gate of the corresponding one of the first, second, and third transistors.

The power supply voltage output terminal TVOUT is a terminal through which a power supply voltage VOUT is output. The power supply voltage VOUT is used as, for example, the internal power supply voltage for the circuit device 20. For example, the power supply voltage VOUT is input to a power supply circuit (not illustrated). The power supply voltage VOUT is then regulated by a regulator of the power supply circuit, and the resultant power supply voltage is supplied to circuits in the circuit device 20. The power supply voltage output terminal TVOUT is connected to a capacitor for voltage stabilization. The capacitor may be an external component. This enables stabilization of the power supply voltage VOUT supplied to internal circuitry of the circuit device 20.

A type of the threshold voltage data DVT (see FIG. 1) stored in the register section 40 is threshold voltage data DVFL for full charge detection. For example, the register section 40 includes a register RG1 for storage of the threshold voltage data DVFL for full charge detection. When the backup voltage data DVBAT exceeds the threshold voltage data DVFL for full charge detection, the power supply control circuit 60 performs control to stop charging the backup element 12 with the main power supply voltage VDD. The situation where the backup voltage data DVBAT exceeds the threshold voltage data DVFL for full charge detection may, for example, be equated with the situation where the voltage represented by the backup voltage data DVBAT exceeds the voltage represented by the threshold voltage data DVFL.

For example, the switches SW1, SW2, and SW3 of the power supply switching circuit 62 under the control of the switch control circuit 64 are turned on so that the backup element 12 can be charged with the main power supply voltage VDD. When being turned on, the switches SW1, SW2, and SW3 form an electrical connection between the main power supply terminal TVDD and the backup power supply terminal TVBAT. Accordingly, the backup element 12 is charged with the main power supply voltage VDD. As the backup element 12 is charged, the backup power supply voltage VBAT rises. When the backup voltage data DVBAT detected by the voltage detection circuit 30 is above the threshold voltage data DVFL for full charge detection, the power supply control circuit 60 performs control to stop charging the backup element 12 with the main power supply voltage VDD. For example, the switches SW2 and SW3 of the power supply switching circuit 62 under the control of the switch control circuit 64 are turned off. In this way, the backup element 12 stops being charged when it is determined that the backup voltage data DVBAT stored in the register section 40 is above the threshold voltage data DVFL for full charge detection; that is, when it is determined that the charging voltage of the backup element 12 has reached the full charge voltage. This enables proper full charge control. Multiple values of the threshold voltage data DVFL may be stored in the register section 40 so that various types of backup elements 12 that differ in full charge voltage can be adopted.

Another type of the threshold voltage data DVT (see FIG. 1) stored in the register section 40 is threshold voltage data DVRC for recharge detection. For example, the register section 40 includes a register RG2 for storage of the threshold voltage data DVRC for recharge detection. When the backup voltage data DVBAT falls below the threshold voltage data DVRC for recharge detection, the power supply control circuit 60 performs control to start (resume) charging the backup element 12 with the main power supply voltage VDD. The situation where the backup voltage data DVBAT falls below the threshold voltage data DVRC for recharge detection may, for example, be equated with the situation where the voltage represented by the backup voltage data DVBAT falls below the voltage represented by the threshold voltage data DVRC.

For example, the switches SW2 and SW3 of the power supply switching circuit 62 under the control of the switch control circuit 64 are OFF when the full state-of-charge is detected. As electricity is discharged from the backup element 12 in a fully charged state, the backup power supply voltage VBAT decreases. When the backup voltage data DVBAT detected by the voltage detection circuit 30 is below the threshold voltage data DVRC for recharge detection, the power supply control circuit 60 performs control to start charging the backup element 12 with the main power supply voltage VDD. For example, the switches SW2 and SW3 of the power supply switching circuit 62 under the control of the switch control circuit 64 are turned on. In this way, the backup element 12 starts being charged when it is determined that the backup voltage data DVBAT stored in the register section 40 is below the threshold voltage data DVRC for recharge detection; that is, when it is determined that the charging voltage of the backup element 12 has fallen to the recharge voltage. This enables proper recharge control. Multiple values of the threshold voltage data DVRC may be stored in the register section 40 so that various types of backup elements 12 that differ in proper recharge voltage can be adopted.

Still another type of the threshold voltage data DVT (see FIG. 1) stored in the register section 40 is threshold voltage data DVEM for detection of a drop in the backup power supply voltage VBAT. For example, the register section 40 includes a register RG3 for storage of the threshold voltage data DVEM for detection of a drop in the backup power supply voltage VBAT. Once being stored in the register section 40, the threshold voltage data DVEM for voltage drop detection may be used to detect a drop in the backup power supply voltage VBAT. The detection results can then be provided to, for example, a processing device external to the circuit device 20. Detecting a drop in the backup power supply voltage VBAT by using the threshold voltage data DVEM allows detection, estimation, or indication of the remaining charge of the backup element 12. For example, the processing circuit 50 obtains the backup voltage data DVBAT from the voltage detection circuit 30 that detects the backup power supply voltage VBAT, and the processing circuit 50 then compares the backup voltage data DVBAT with the threshold voltage data DVEM for voltage drop detection. When the processing circuit 50 determines that the backup voltage data DVBAT is below the threshold voltage data DVEM, the interrupt generation circuit 70 outputs an interrupt signal INT to provide an indication to the external processing device. This will be described later. In this way, the external processing device detects a drop in the backup power supply voltage VBAT. When it is determined that the backup voltage data DVBAT is below the threshold voltage data DVEM, the register in the register section 40 is provided with flag information indicating that a voltage drop is detected.

The backup voltage data DVBAT detected by the voltage detection circuit 30 is stored in the register section 40. For example, the register section 40 includes a register RG4 for storage of the backup voltage data DVBAT. The backup voltage data DVBAT is output to the outside through, for example, the interface circuit 80. For example, an external processing device accesses the register section 40 through the interface circuit 80 to read the backup voltage data DVBAT detected by the voltage detection circuit 30. In this way, the backup voltage data DVBAT detected by the voltage detection circuit 30 can be output to the outside of the circuit device 20 or can be stored in the circuit device 20. This makes it possible to keep track of changes in the backup power supply voltage VBAT, which can thus be put to various uses.

FIG. 3 illustrates examples of the registers RG1, RG2, RG3, and RG4 included in the register section 40 in FIG. 2. The registers RG1, RG2, RG3, and RG4 may, for example, be 8-bit registers as illustrated in FIG. 3. The register RG1 stores 8 bits of the threshold voltage data DVFL for full charge detection, and the register RG2 stores 8 bits of the threshold voltage data DVRC for recharge detections. The register RG3 stores 8 bits of the threshold voltage data DVEM for voltage drop detection. Referring to FIG. 3, the register RG4, which stores the backup voltage, is an 8-bit register. Alternatively, the register RG4 may be a 16-bit register or any other register that can handle more than 8 bits of data.

In the present embodiment, the threshold voltage data DVT, such as the threshold voltage data DVFL for full charge detection, the threshold voltage data DVRC for recharge detection, and the threshold voltage data DVEM for voltage drop detection, are multi-bit data. This means that multiple values of the threshold voltage data DVT can be represented by the multiple bits and can be stored in the register section 40 for the sake of comparison with the backup voltage data DVBAT obtained from the voltage detection circuit 30. For example, the threshold voltage data DVT with a resolution defined by the number of bits (e.g., a resolution of about 60 mV) can be stored in register section 40, and the processing circuit 50 can therefore compare the backup voltage data DVBAT with the threshold voltage data DVT at the resolution. Although FIG. 3 illustrates an example in which the number of data bits is 8, the present embodiment is not limited to the example. The number of data bits may be less or more than 8. For example, 4-bit data or 16-bit data may be handled.

As illustrated in FIGS. 2 and 4, the voltage detection circuit 30 includes a voltage sensor 32. The voltage sensor 32 is a circuit where the backup power supply voltage VBAT is input in analog form as detection target voltage. The voltage sensor 32 outputs the backup voltage data DVBAT in digital form. An example configuration of the voltage sensor 32 will be described in detail later.

As illustrated in FIGS. 2 and 4, the voltage detection circuit 30 includes a comparator circuit 34. The comparator circuit 34 compares the main power supply voltage VDD with the threshold voltage VDT for detection of a drop in the main power supply voltage VDD. The comparator circuit 34 is also simply referred to as a comparator. For example, the main power supply voltage VDD is input to a first input terminal (e.g., a non-inverting input terminal) of the comparator circuit 34, and the threshold voltage VDT for detecting a drop in the main power supply voltage VDD is input to a second input terminal (e.g., an inverting input terminal) of the comparator circuit 34. The comparator circuit 34 then outputs a comparison result signal CPQ. For example, the comparator circuit 34 outputs the comparison result signal CPQ at a first voltage level (e.g., high level) when VDD≥VDT, and the comparator circuit 34 outputs the comparison result signal CPQ at a second voltage level (e.g., low level) when VDD<VDT.

When the main power supply voltage VDD falls below the threshold voltage VDT for voltage drop detection, the power supply voltage VOUT that is to be supplied to the internal circuitry of the circuit device 20 is switched from the main power supply voltage VDD to the backup power supply voltage VBAT by the power supply control circuit 60. For example, the comparator circuit 34 outputs the comparison result signal CPQ at the second voltage level when VDD<VDT. Upon receipt of the comparison result signal CPQ, the processing circuit 50 gives an instruction to the power supply control circuit 60 so that the power supply voltage VOUT that is to be supplied to the internal circuitry is switched from the main power supply voltage VDD to the backup power supply voltage VBAT. The switch control circuit 64 then performs control in accordance with the instruction given by the processing circuit 50. In the example illustrated in FIG. 2, the switch SW1 of the power supply switching circuit 62 is turned off, and the switches SW2 and SW3 of the power supply switching circuit 62 are turned on. As a result, the backup power supply terminal TVBAT and the power supply voltage output terminal TVOUT are electrically connected via the switches SW2 and SW3 such that the power supply voltage VOUT that is to be supplied to the internal circuitry is switched from the main power supply voltage VDD to the backup power supply voltage VBAT. That is, when the main power supply voltage VDD decreases and falls below the threshold voltage VDT for voltage drop detection, the internal circuitry of the circuit device 20 is cut off from the supply of the main power supply voltage VDD and is supplied with the backup power supply voltage VBAT, which is held by the backup element 12. For example, when the power supply is cut off, the main power supply voltage VDD decreases, in which case the backup power supply voltage VBAT from the backup element 12 is supplied for the operation of the internal circuitry of the circuit device 20. The threshold voltage VDT may, for example, be the voltage at which the internal circuitry of the circuit device 20 can operate. For example, the threshold voltage VDT is in the range of about 1.4 to 1.5 V. When the main power supply voltage VDD falls below the threshold voltage VDT, the internal circuitry of the circuit device 20 is supplied with the backup power supply voltage VBAT instead of the main power supply voltage VDD such that the internal circuitry can operate properly. The comparator circuit 34 preferably produces hysteresis in the threshold voltage VDT; that is, the threshold voltage for the low-to-high transition of the main power supply voltage VDD is preferably higher than the threshold voltage for the high-to-low transition of the main power supply voltage VDD. This precludes the unstable operation of the circuitry at the time when the main power supply voltage VDD is at about the threshold voltage.

As illustrated in FIG. 2, the circuit device 20 includes the interface circuit 80 for access to the register section 40. The interface circuit 80 is a circuit for communication with an external processing device. The processing device external to the circuit device 20 can access the register section 40 through the interface circuit 80 to write data into the register section 40 or to read data from the register section 40.

The interface circuit 80 may, for example, perform communication with the external processing according to a given communication standard. For example, the interface circuit 80 performs communication using a serial communication protocols, such as Inter-Integrated Circuit (I2C) or Serial Peripheral Interface (SPI). The interface circuit 80 performs serial communication based on data DA and a clock signal CK. The data DA is transferred to the interface circuit 80 via a data terminal TDA, and the clock signal CK is input to the interface circuit 80 via a clock terminal TCK. The SPI may be a 3-wire SPI or a 4-wire SPI. In a 3-wire SPI configuration, the data terminal TDA is an input/output terminal for the data DA. In a 4-wire SPI configuration, separate data terminals TDA, one for data input and the other for data output, may be provided. The interface circuit 80 may be capable of performing switching among different serial communication protocols, such as I2C, 3-wire SPI, and 4-wire SPI. To this end, the circuit device 20 may include a switching terminal that enables switching among the serial communication protocols.

The threshold voltage data DVT for storage in the register section 40 is provided to the register section 40 through the interface circuit 80. The threshold voltage data DVT (DVFL, DVRC, DVEM) for comparison with the backup voltage data DVBAT is written into the register section 40 through the interface circuit 80 by, for example, an external processing device. That is, multiple values of the threshold voltage data DVT can be written into the register section 40 through the interface circuit 80. For example, values of the threshold voltage VDT that are appropriate for detection purposes can be written into the register section 40 as the threshold voltage data DVFL for full charge detection, the threshold voltage data DVRC for recharge detection, and the threshold voltage data DVEM for voltage drop detection. The threshold voltage data DVT appropriate to the respective types of the backup elements 12 may be written into the register section 40. This enables the power supply control circuit 60 to perform charge control on the basis of the result of comparison of the threshold voltage data DVT written into the register section 40 and the backup voltage data DVBAT obtained from the voltage detection circuit 30.

The backup voltage data DVBAT detected by the voltage detection circuit 30 is stored in the register section 40. Referring to FIG. 2, the register RG4 included in the register section 40 stores the backup voltage data DVBAT. The interface circuit 80 outputs the backup voltage data DVBAT stored in the register section 40. For example, an external processing device accesses the register section 40 to read the backup voltage data DVBAT. The backup voltage data DVBAT stored in the register section 40 is then output to the outside through the interface circuit 80. In this way, the backup voltage data DVBAT detected by the voltage detection circuit 30 can be output to the outside through the interface circuit 80. As a result, the external processing device can perform various kinds of control and setting by monitoring the backup power supply voltage VBAT on the basis of the backup voltage data DVBAT output through the interface circuit 80.

As mentioned above, the conventional technique disclosed in JP-A-2014-017965 involves the use of comparator circuits that simply compare the backup power supply voltage with a fixed value of reference voltage, in which case it is not feasible to monitor the value of the backup power supply voltage. This issue is addressed by the present embodiment, in which the backup voltage data DVBAT detected by the voltage detection circuit 30 is stored in the register section 40, and the backup voltage data DVBAT can be output to the outside through the interface circuit 80. The external processing device can thus perform various kinds of control and setting by monitoring the backup voltage data DVBAT.

As illustrated in FIG. 2, the circuit device 20 includes the interrupt generation circuit 70. The interrupt generation circuit 70 generates the interrupt signal INT based on the result of comparison of the backup voltage data DVBAT and the threshold voltage data DVT (DVFL, DVRC, DVEM). The interrupt signal INT is output to the outside through, for example, an interrupt output terminal TINT of the circuit device 20. For example, the interrupt signal INT at the time of occurrence of an interrupt is at a predetermined voltage level (e.g., low level). Such a circuit that outputs the interrupt signal INT through the interrupt output terminal TINT may be implemented by an open-drain n-type transistor or the like. When a predetermined state (e.g., a fully charged state or a recharge state) is detected on the basis of the result of the comparison of the backup voltage data DVBAT and the threshold voltage data DVT, the interrupt signal INT is output to the outside from the interrupt generation circuit 70 to indicate the detection of the predetermined state.

When determining that the backup voltage data DVBAT is above the threshold voltage data DVFL for full charge detection, the processing circuit 50 outputs a signal, upon receipt of which the interrupt generation circuit 70 generates the interrupt signal INT. Meanwhile, flag information indicating the detection of a fully charged state is stored in the register section 40 as an interrupt factor. This will be described later. When receiving the interrupt signal INT generated by the interrupt generation circuit 70, the external processing device detects the occurrence of an interrupt and then reads the flag information for full charge detection from the register section 40. In this way, the external processing device detects a fully charged state.

When determining that the backup voltage data DVBAT is below the threshold voltage data DVEM for voltage drop detection, the processing circuit 50 outputs a signal, upon receipt of which the interrupt generation circuit 70 generates the interrupt signal INT. Meanwhile, flag information indicating the detection of a voltage drop is stored in the register section 40 as an interrupt factor. When receiving the interrupt signal INT generated by the interrupt generation circuit 70, the external processing device detects the occurrence of an interrupt and then reads the flag information for voltage drop detection from the register section 40. In this way, the external processing device detects a state in which the backup power supply voltage VBAT is below the threshold voltage for voltage drop detection.

Figure 5:
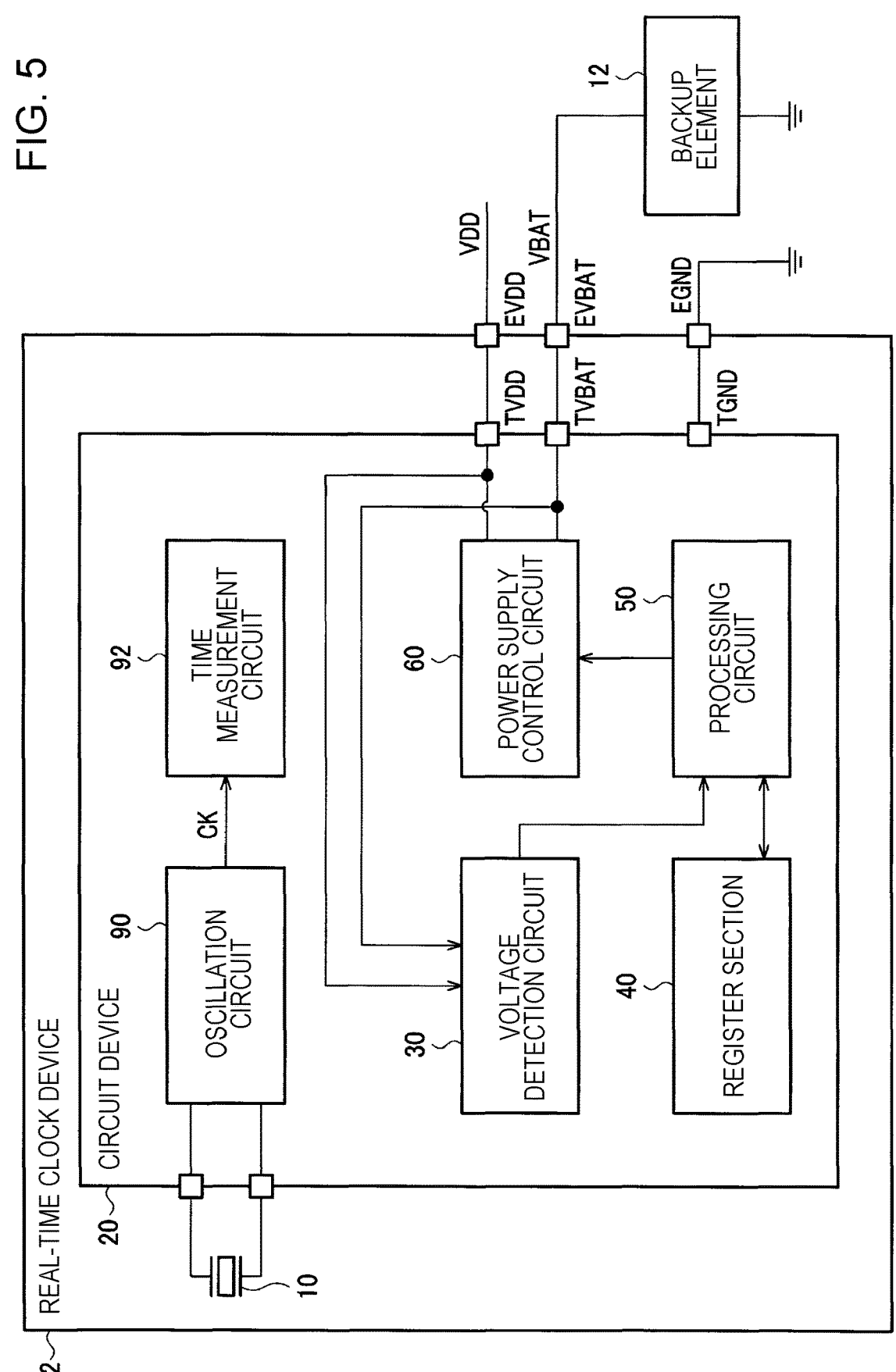
FIG. 5 illustrates an example configuration of a real-time clock device including the circuit device.

FIG. 5 illustrates an example configuration of a real-time clock device 22 according to the present embodiment. The real-time clock device 22 includes the circuit device 20 and a resonator 10. In addition to the voltage detection circuit 30, the register section 40, the processing circuit 50, and the power supply control circuit 60, an oscillation circuit 90 and a time measurement circuit 92 are included in the circuit device 20. The oscillation circuit 90 generates the clock signal CK by causing the resonator to oscillate. The time measurement circuit 92 performs time measurement processing based on the clock signal CK. The real-time clock device 22 generates time information through time measurement based on the clock signal CK. The real-time clock device 22 is, for example, a real-time clock module. The configuration of the real-time clock device 22 according to the present embodiment is not limited to the one illustrated in FIG. 5. A wide range of variations can be devised by omitting some of the constituent components, adding another component, and/or replacing some of the constituent components with other components. The circuit device 20 of the real-time clock device 22 may include the interface circuit 80 and the interrupt generation circuit 70, which are described above with reference to FIG. 2. In some embodiments, the circuit device 20 includes other circuits, such as an alarm circuit configured to raise an alarm on the basis of the results of the time measurement processing performed by the time measurement circuit 92 and a watchdog timer circuit configured to perform watchdog timer processing on the basis of the results of the time measurement processing.

The resonator 10 is an element that generates mechanical vibrations from electrical signals. The resonator 10 may, for example, be a quartz crystal resonator element. For example, the resonator 10 is an AT-cut or SC-cut quartz crystal resonator that vibrates in the thickness-shear mode, a tuning fork quartz crystal resonator element, or a double-ended tuning fork quartz crystal resonator element. Examples of the resonator 10 in the present embodiment include various types of resonator elements. For example, the resonator 10 may be a resonator element other than the thickness-shear-mode resonator elements, the tuning fork resonator elements, and the double-ended tuning fork resonator elements or may be a piezoelectric resonator element made of a material other than quartz crystal. A surface acoustic wave (SAW) resonator or a micro-electro-mechanical systems (MEMS) resonator that is a silicon resonator element including a silicon substrate may be used as the resonator 10.

The oscillation circuit 90 outputs the clock signal CK. The oscillation circuit 90 may, for example, generate an oscillation signal responsive to the oscillation of the resonator 10 and output the clock signal CK based on the oscillation signal. For example, the resonator 10 (e.g., a quartz crystal resonator) driven by a drive circuit oscillates such that a sinusoidal oscillation signal is generated. The oscillation signal is then processed by a waveform shaping circuit, and the resultant signal is output from the oscillation circuit 90 as the clock signal CK in the form of a rectangular wave. The clock signal CK is a clock signal with a frequency of, for example, 32.768 KHz. The frequency of the clock signal CK is not limited to this value. The clock signal CK may for example, be a signal with a frequency of 32 KHz. The circuit device 20 may include a clock output terminal through which the clock signal CK or a signal generated by dividing its frequency is output.

The time measurement circuit 92 performs time measurement processing based on the clock signal CK to generate time information. For example, the time measurement circuit 92 includes a frequency divider circuit and a time counter (not illustrated). The frequency divider circuit divides the frequency of the clock signal CK from the oscillation circuit 90 and outputs the resultant frequency-divided clock signal. The time counter performs time count processing on the basis of the frequency-divided clock signal from the frequency divider circuit. The time count processing is performed by the time counter such that the time measurement circuit 92 generates time information indicating the present time. The time information is time measurement data and may include data indicating seconds, minutes, hours, days, months, years, and so on. The time measurement counter includes a counter for counting seconds, a counter for counting minutes, a counter for counting hours, a counter for counting days, a counter for counting months, and a counter for counting years. The time measurement counter generates time information on the basis of the count processing performed by the individual counters. The generated time information is output to the outside as time stamp information through, for example, the interface circuit 80 illustrated in FIG. 2. The real-time clock device 22 can perform clock and calendar functions through the time measurement processing in the time measurement circuit 92.

The real-time clock device 22 includes a main power supply terminal EVDD, a backup power supply terminal EVBAT, and a ground terminal EGND, which are power supply terminals for external connection. The main power supply terminal EVDD, the backup power supply terminal EVBAT, and the ground terminal EGND are electrically connected to the main power supply terminal TVDD, the backup power supply terminal TVBAT, and the ground terminal TGND, respectively, of the circuit device 20. The real-time clock device 22 may also include a power supply voltage output terminal for external connection or, more specifically, a power supply voltage output terminal that is electrically connected to the power supply voltage output terminal TVOUT of the circuit device 20. The circuit device 20, which is a semiconductor IC, and the resonator 10 may, for example, be accommodated in a package to constitute the real-time clock device 22. The main power supply terminal EVDD, the backup power supply terminal EVBAT, and the ground terminal EGND, which are terminals for external connection, may be provided in the package.

The clock and calendar functions of real-time clocks can be achieved by the real-time clock device 22 according to the present embodiment in which the time measurement circuit 92 performs the time measurement processing based on the clock signal CK from the oscillation circuit 90. Furthermore, the real-time clock device 22 according to the present embodiment can perform the charging control on the backup element 12 for charging with the main power supply voltage VDD by using the backup voltage data detected by the voltage detection circuit 30 and the threshold voltage data stored in the register section 40. The real-time clock device 22 may be adopted into, for example, factory automation (FA) equipment, Internet of Things (IOT) devices, household electronic appliances, or vehicle-mounted devices, for the purpose of not only obtaining and/or monitoring the time information but also controlling the charging of the backup element 12 (e.g., a secondary battery or a supercapacitor). The real-time clock device 22 according to the present embodiment can serve both of these purposes. The charging control performed on the backup element 12 is based on the backup voltage data detected by the voltage detection circuit 30 and the threshold voltage data stored in the register section 40. This approach offers an advantage in that charging control can be flexibly performed for various types of backup elements 12, as mentioned above.

2. Specific Operation Examples

Figure 6:
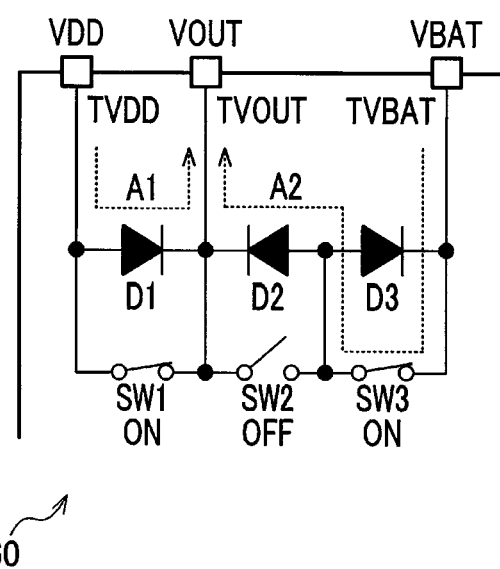
FIG. 6 illustrates the operation of a power supply control circuit on a power-up.

The following describes specific operation examples in the present embodiment. FIG. 6 illustrates the operation on a power-up. Immediately after the power-up, the switches SW1 and SW3 of the power supply control circuit 60 are turned on as illustrated in FIG. 6, where the switch SW2 is OFF. The main power supply terminal TVDD and the backup power supply terminal TVBAT are connected in parallel to the power supply voltage output terminal TVOUT via the diodes D1 and D2. As a result, the main power supply voltage VDD from the main power supply terminal TVDD is stepped down by the amount of the forward voltage of diode D1 and is then supplied to the node of the power supply voltage VOUT through the path denoted by A1 in FIG. 6. As a result, the backup power supply voltage VBAT from the backup power supply terminal TVBAT is stepped down by the amount of the forward voltage of the diode D2 and is then supplied to the node of the power supply voltage VOUT through the path denoted by A2. The main power supply voltage VDD may, for example, be about 3.3 V.

Figure 7:
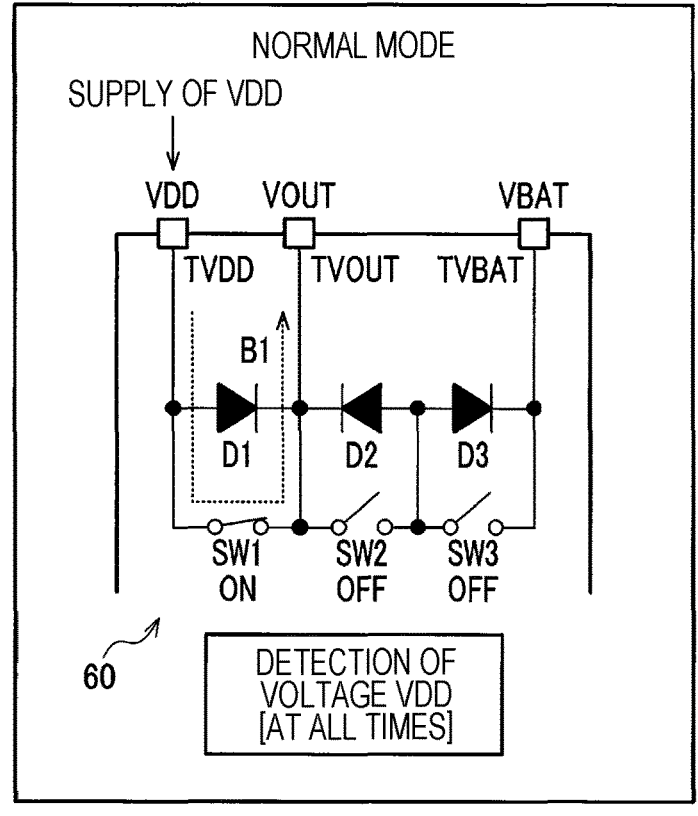
FIG. 7 illustrates an example of switching control performed by the power supply control circuit.
Figure 7:
Figure 7:
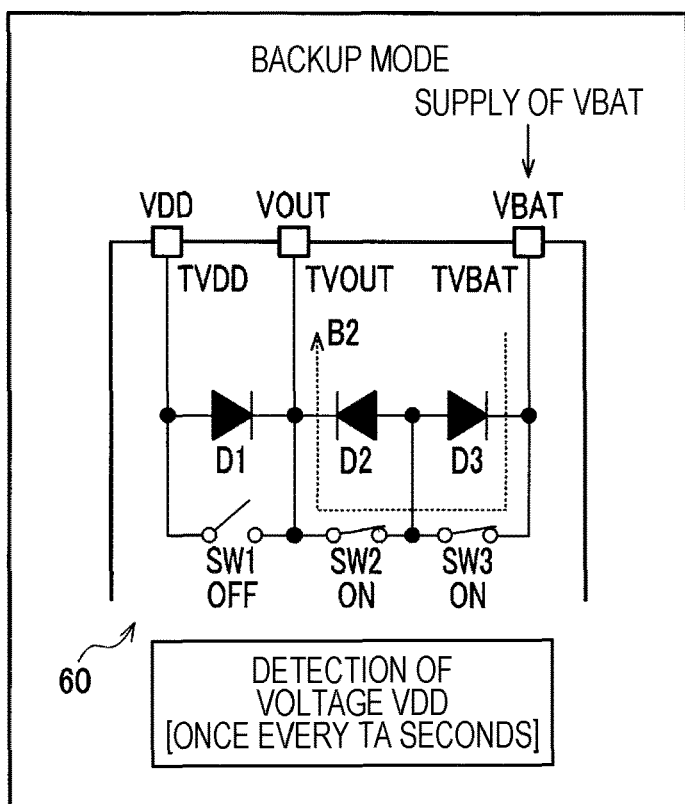

FIG. 7 illustrates the operation in the present embodiment by taking as an example a case in which the backup element 12 is a primary battery. Referring to FIG. 7, a normal mode is a mode of operation in which the switch SW1 of the power supply control circuit 60 is turned on, where the switches SW2 and SW3 are OFF. In this state, the main power supply voltage VDD from the main power supply terminal TVDD is supplied to the node of the power supply voltage VOUT through the path denoted by B1 in FIG. 7. The internal circuitry of the circuit device 20 thus operates with the power supply voltage VOUT based on the main power supply voltage VDD. The comparator circuit 34 described above with reference FIG. 4 compares the main power supply voltage VDD with the threshold voltage VDT at all times during the normal mode operation.

The transition from the normal mode to a backup mode takes place when the main power supply voltage VDD falls below the threshold voltage VDT. During the backup mode operation, the main power supply voltage VDD is compared with the threshold voltage VDT, for example, once every TA seconds. For example, the TA seconds are in the range of 20 to 40 ms. The transition from the backup mode to the normal mode takes place when the main power supply voltage VDD reaches or exceeds the threshold voltage VDT. The threshold voltage VDT at the time of transition from the backup mode to the normal mode is set at a value higher than the threshold voltage VDT at the time of transition from the normal mode to the backup mode. This feature can be achieved through the use of the comparator circuit 34 with a hysteresis function.

Figure 8:
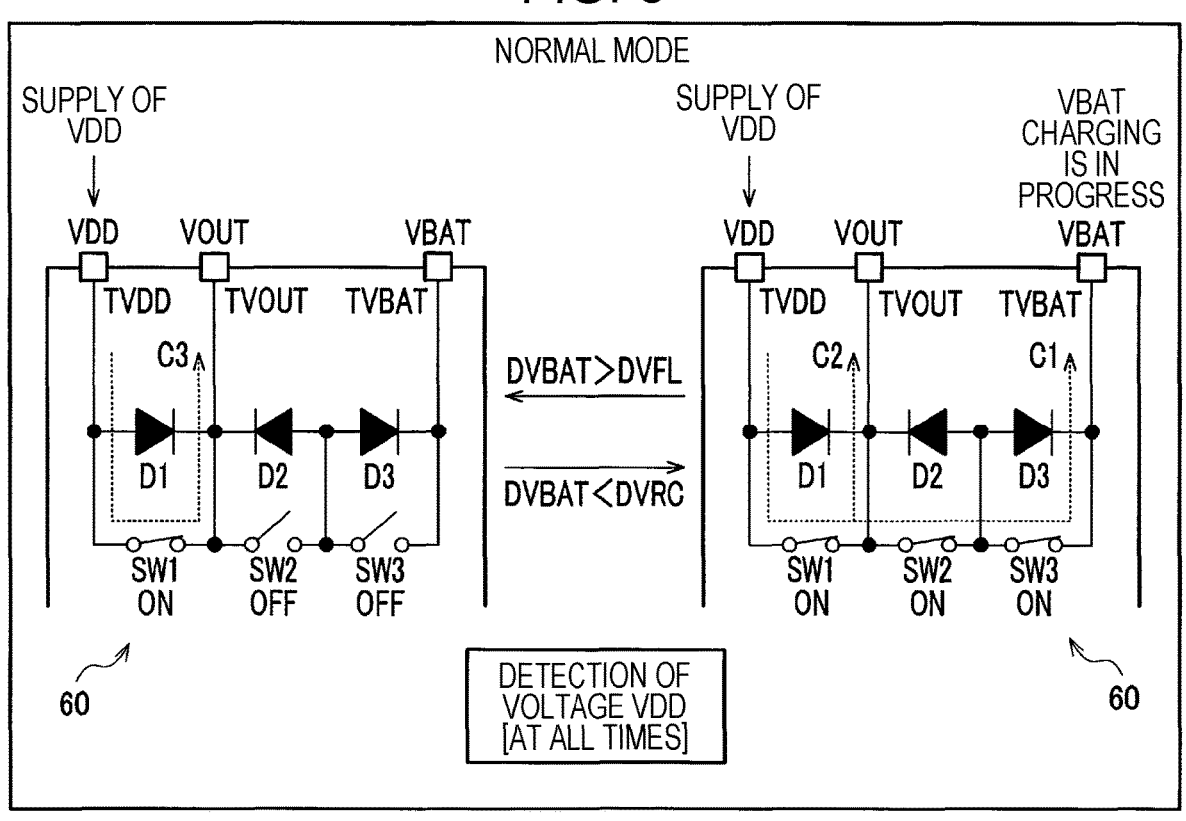
FIG. 8 illustrates another example of the switching control performed by the power supply control circuit.
Figure 8:
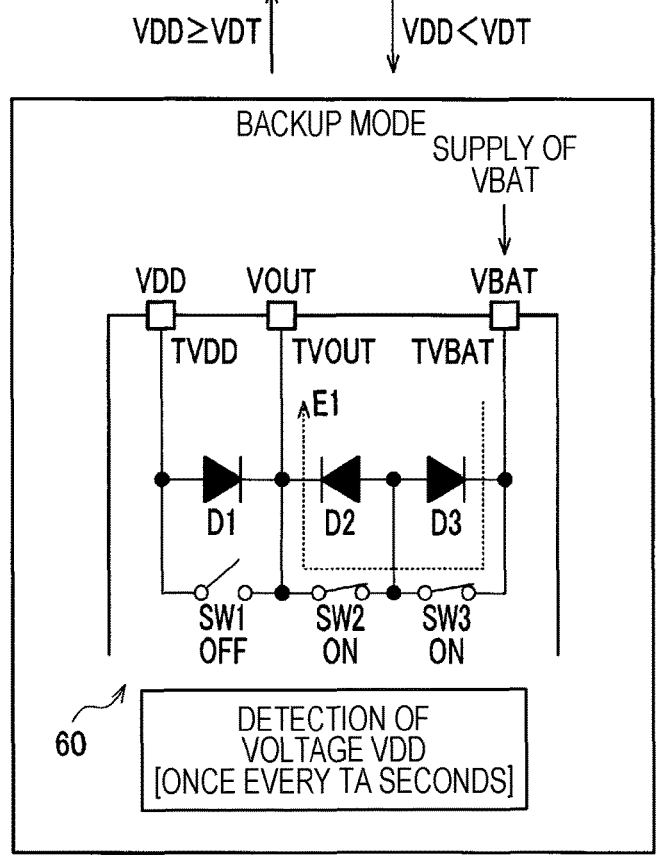

FIG. 8 illustrates the operation in the present embodiment by taking as an example a case in which the backup element 12 is a secondary battery or a supercapacitor. Referring to FIG. 8, a normal mode is a mode of operation in which all of the switches SW1, SW2, and SW3 of the power supply control circuit 60 are turned on when the backup voltage data DVBAT detected by the voltage detection circuit 30 is below the threshold voltage data DVRC that is stored in the register section 40 to serve the recharge detection purpose. In this state, the backup element 12 is charged with the main power supply voltage VDD, as indicated by C1. Meanwhile, the main power supply voltage VDD is supplied as the power supply voltage VOUT for the internal circuitry of the circuit device 20, as indicated by C2.

When the backup voltage data DVBAT exceeds the threshold voltage data DVFL that is stored in the register section 40 to serve the full charge detection purpose, the switches SW2 and SW3 of the power supply control circuit 60 are turned off. Meanwhile, the switch SW1 is kept in the ON state. As a result, the backup element 12 stops being charged with the main power supply voltage VDD. Meanwhile, the main power supply voltage VDD is supplied as the power supply voltage VOUT for the internal circuitry of the circuit device 20, as indicated by C3.

The transition from the normal mode to a backup mode takes place when the main power supply voltage VDD falls below the threshold voltage VDT, in either of the two cases (irrespective of whether charging is in progress or not) during the normal mode operation. In this case, constant monitoring of the main power supply voltage VDD is performed at all times. During the backup mode operation, the main power supply voltage VDD is compared with the threshold voltage VDT, for example, once every TA seconds. The transition from the backup mode to the normal mode takes place when the main power supply voltage VDD reaches or exceeds the threshold voltage VDT.

As described above with reference to FIG. 2, the register section 40 in the present embodiment is the location of storage of the backup voltage data DVBAT detected by the voltage detection circuit 30, and the interface circuit 80 outputs the backup voltage data DVBAT stored in the register section 40. In the present embodiment, the backup voltage data DVBAT at the time specified through the interface circuit 80 may, for example, be stored in the register section 40. In a first mode, for example, the backup voltage data DVBAT that is output from the voltage detection circuit 30 every time when a given period elapses is stored in the register section 40. This means that the backup voltage data DVBAT stored in register section 40 is updated every time when a given period elapses. In a second mode, the backup voltage data DVBAT at the time specified through the interface circuit 80 is stored in the register section 40. Thus, the backup voltage data DVBAT at the time specified through the interface circuit 80 can be read from the register section 40 by an external processing device through the interface circuit 80. That is, the external processing device can obtain the backup voltage data DVBAT at the desired time to monitor the backup power supply voltage VBAT of the backup element 12.

Figure 9:
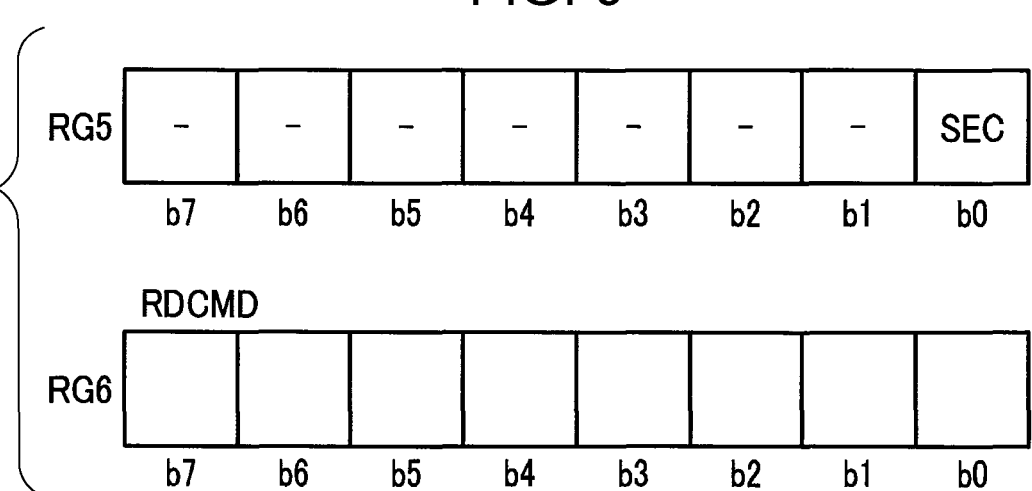
FIG. 9 illustrates latch control performed on backup voltage data.
Figure 10:
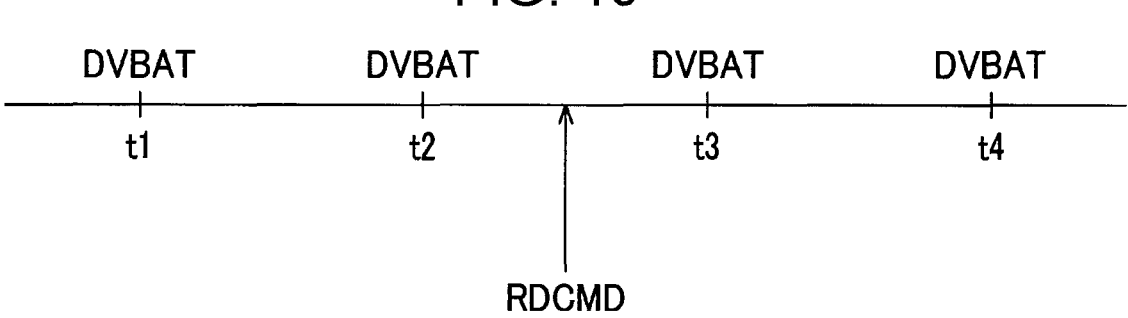
FIG. 10 illustrates the latch control performed on the backup voltage data.

For example, the register section 40 includes registers denoted by RG5 and RG6 in FIG. 9. When SEC for latch control in bit b0 of the register RG5 is set to 1, a latch mode, namely, the second mode mentioned above is enabled. When SEC is set to 0, the latch mode is disabled. When the external processing device writes a command RDCMD into the register RG6, the backup voltage data DVBAT at the time when the command is written is latched into the register in the register section 40 and is retained therein. Referring to FIGS. 10, t1, t2, t3, and t4 denote timings of output of the backup voltage data DVBAT from the voltage detection circuit 30. The backup voltage data DVBAT is written into the register in the register section 40. When the external processing device writes the command RDCMD into the register RG6 through the interface circuit 80 in the state in which the bit of SEC in the register RG5 in FIG. 9 is set to 1, the backup voltage data DVBAT at the time t2 immediately before the time when the command is written is latched into the register in register section 40 and is retained therein. Then, the external processing device performs readout operation on the register through the interface circuit 80. As a result, the backup voltage data DVBAT at the time t2 in FIG. 10 is read out.

Figure 11:
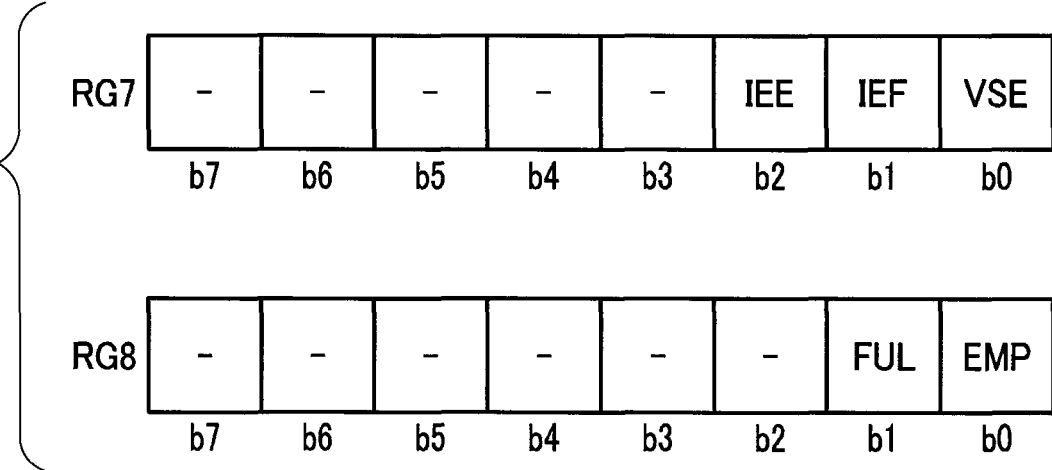
FIG. 11 illustrates examples of registers included in an interrupt generation circuit.

FIG. 11 illustrates the operation of the interrupt generation circuit 70 illustrated in FIG. 2. The register section 40 includes registers denoted by RG7 and RG8 in FIG. 11. IEE in bit b2 of the register RG7 is set to 1 to permit an interrupt for voltage drop detection. IEF in bit b1 of the register RG7 is set to 1 to permit an interrupt for full charge detection. VSE in bit b0 of the register RG7 is a bit for enabling or disabling the monitoring of the backup power supply voltage VBAT.

When it is determined that the backup voltage data DVBAT is above the threshold voltage data DVFL in a state in which an interrupt for full charge detection is permitted by means of IEF in the register RG7, the interrupt generation circuit 70 in FIG. 2 outputs the interrupt signal INT. Meanwhile, FUL in bit b1 of the register RG8 for the interrupt factor may, for example, be set to 1. The interrupt signal INT informs the external processing device of the occurrence of an interrupt, in which case the external processing device reads FUL from the register RG8 through the interface circuit 80. The external processing device can thus determine that the full state-of-charge is detected.

When it is determined that the backup voltage data DVBAT is below the threshold voltage data DVEM in a state in which an interrupt for voltage drop detection is permitted by means of IEE in the register RG7, the interrupt generation circuit 70 outputs the interrupt signal INT. Meanwhile, EMP in bit b0 of the register RG8 for the interrupt factor may, for example, be set to 1. The interrupt signal INT informs the external processing device of the occurrence of an interrupt, in which case the external processing device reads EMP from the register RG8 through the interface circuit 80. The external processing device can thus determine that a drop in the backup power supply voltage VBAT is detected.

3. Voltage Sensor

Figure 12:
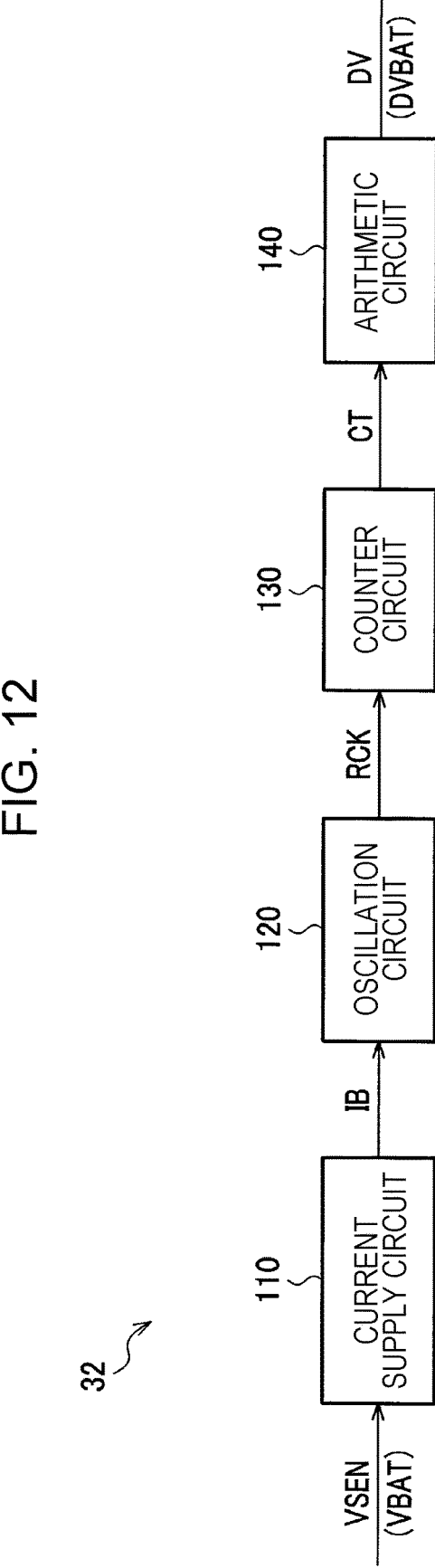
FIG. 12 illustrates a configuration example of a voltage sensor.

FIG. 12 illustrates an example configuration of the voltage sensor 32 described above with reference to FIGS. 2 and 4. The backup power supply voltage VBAT is input to the voltage sensor 32 as detection target voltage VSEN, and the backup voltage data DVBAT is output from the voltage sensor 32 as voltage data DV. As illustrated in FIG. 12, the voltage sensor 32 includes a current supply circuit 110, an oscillation circuit 120, a counter circuit 130, and an arithmetic circuit 140.

The current supply circuit 110 supplies the oscillation circuit 120 for voltage detection with a current that varies with the detection target voltage VSEN (VBAT). The current is herein referred to as a supply current IB. The amperage of the supply current IB increases with increasing detection target voltage VSEN.

The oscillation circuit 120, the oscillation frequency of which varies with the supply current IB, is provided for the purpose of detecting voltage. For example, the oscillation frequency of the oscillation circuit 120 increases with increasing amperage of the supply current IB. The oscillation circuit 120 may, for example, be a ring oscillator composed of an odd number of signal inversion circuits connected in a ring (loop). The signal inversion circuits may, for example, be inverter circuits or NAND circuits. The supply current IB flowing from a power supply on the high-potential side to a power supply on the low-potential side is controlled by each of the signal inversion circuits, and the oscillation frequency of the oscillation circuit 120 is controlled accordingly. For example, the higher the amperage of the supply current IB is, the higher the oscillation frequency is.

The counter circuit 130 performs, in a given period, count processing on an output clock signal RCK from the oscillation circuit 120 for voltage detection. For example, the counter circuit 130 counts the number of pulses (the number of clocks) of the output clock signal RCK in a given period and outputs a count value CT.

The arithmetic circuit 140 performs arithmetic computations to obtain voltage data DV (DVBAT) corresponding to the detection target voltage VSEN on the basis of the count value CT obtained in the count processing performed in a state in which the oscillation circuit 120 for voltage detection is supplied with the supply current IB.

Figure 13:
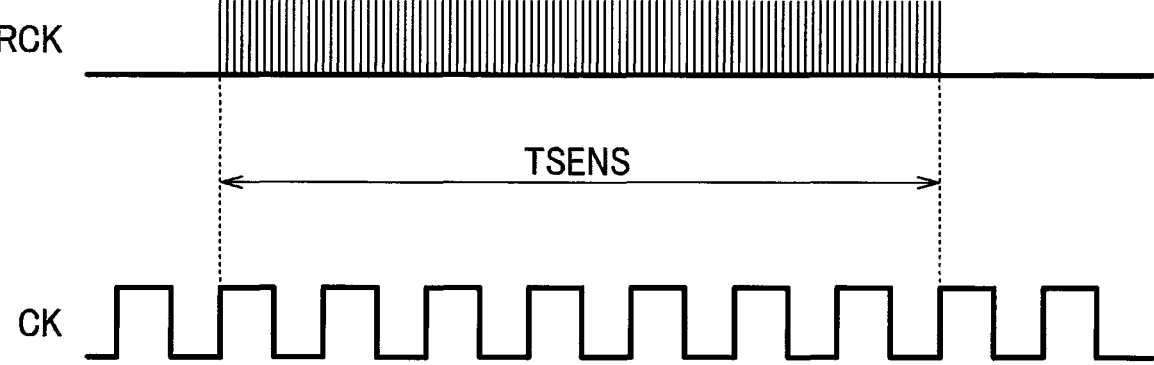
FIG. 13 is a signal waveform diagram illustrating the operation of the voltage sensor.

FIG. 13 is a signal waveform diagram illustrating the operation of the voltage sensor 32. The clock signal CK in FIG. 13 is an oscillation clock signal generated by the oscillation circuit 90 causing the resonator 10 (see FIG. 5) to oscillate. TSENS in FIG. 13 denotes the given period that is specified for the counter circuit 130 and is defined on the basis of the clock signal CK generated by the oscillation circuit 90. For example, the duration of the period TSENS corresponds to a predetermined number of pulses of the clock signal CK. For example, the period TSENS is set on the basis of the count processing performed to determine the number of pulses of the clock signal CK generated by the oscillation circuit 90. Then, the counter circuit 130 outputs the count value CT obtained by counting the number of pulses of the output clock signal RCK in the period TSENS. The clock signal CK is a clock signal generated by the oscillation circuit 90 causing the resonator 10 to oscillate. The duration of the period TSENS set on the basis of the clock signal CK is therefore highly accurate. The duration of the period TSENS can be much more accurate, especially when quartz crystal is used as the resonator 10. The voltage data DV is obtained by arithmetic computations based on the count value CT indicating the number of pulses of the output clock signal RCK in the period TSENS that is highly accurate. This offers an advantage in that the voltage sensor 32 in FIG. 12 can output the voltage data DV obtained with greater accuracy.

That is, the operation of the voltage sensor 32 mentioned above is as follows. The oscillation circuit 120 of the voltage sensor 32 is supplied with the supply current IB whose amperage varies with the detection target voltage VSEN. The output clock signal RCK is obtained from the oscillation circuit 120, where the oscillation frequency of the oscillation circuit 120 varies with the supply current IB. The output clock signal RCK undergoes the count processing in the given period TSENS. Then, arithmetic computations are performed on the count value CT obtained in the count processing. In this way, the voltage sensor 32 can obtain the voltage data DV corresponding to the detection target voltage VSEN. This feature offers an advantage in that the accuracy of the detection of the detection target voltage VSEN can be adjusted in several ways. For example, the given period TSENS during which the count processing is performed may be set to an appropriate length, or the arithmetic computational algorithm for use in the arithmetic circuit 140 may be changed. Furthermore, it can be ensured that the detection accuracy is not limited by the performance capabilities of analog circuits.

The current supply circuit 110 illustrated in FIG. 12 may, for example, include a resistor and a diode-connected transistor in series between a supply node of the detection target voltage VSEN and a node of the power supply on the low-potential side (e.g., GND) and may also include a current mirror circuit that supplies the supply current IB by coping a current flowing through the transistor. The diode-connected transistor is, for example, an n-type transistor where the drain and the gate connected to each other. Provided that the gate-source voltage of this diode-connected transistor is Vth+Vod, the voltage at the connection node between the resistor and the transistor is Vth+Vod. Vth is the threshold voltage of the diode-connected transistor. Therefore, the voltage at both ends of the resistor is VSEN−(Vth+Vod). The current flowing through the resistor is thus expressed by the following equation: IB={VSEN−(Vth+Vod)}/R1, where R1 is the resistance of the resistor. The current given by the expression IB={VSEN−(Vth+Vod)}/R1, which is a current whose amperage varies with the detection target voltage VSEN, is then supplied to the oscillation circuit 120. The configuration of the voltage sensor 32 is not limited to the one illustrated in FIG. 12. The voltage sensor 32 may, for example, be a circuit that generates voltage data through A/D conversion of the detection target voltage.

As described above, a circuit device according to the present embodiment includes: a main power supply terminal through which a main power supply voltage is supplied; a backup power supply terminal through which a backup power supply voltage from a backup element is supplied; and a voltage detection circuit that detects the backup power supply voltage and outputs backup voltage data corresponding to the backup power supply voltage. The circuit device also includes: a register section in which threshold voltage data for comparison with the backup voltage data is stored; a processing circuit that compares the backup voltage data with the threshold voltage data; and a power supply control circuit that performs charging control on the backup element for charging with the main power supply voltage on the basis of the result of a comparison made by the processing circuit.

In the present embodiment, the charging control can be performed on the backup element on the basis of the result of the comparison of the threshold voltage data stored in the register section and the backup voltage data obtained from the voltage detection circuit that detects the backup power supply voltage. This enables flexible threshold settings for the charging control. As a result, the charging control can be performed on the backup element in the flexible manner.

In the present embodiment, threshold voltage data for full charge detection may be stored in the register section as the threshold voltage data. When the backup voltage data exceeds the threshold voltage data for full charge detection, the power supply control circuit may perform control to stop charging the backup element with the main power supply voltage.

In this way, the backup element stops being charged when it is determined that the backup voltage data stored in the register section is above the threshold voltage data for full charge detection; that is, when it is determined that the charging voltage of the backup element has reached the full charge voltage.

In the present embodiment, threshold voltage data for recharge detection may be stored in the register section as the threshold voltage data. When the backup voltage data falls below the threshold voltage data for recharge detection, the power supply control circuit may perform control to start charging the backup element with the main power supply voltage.

In this way, the backup element starts being charged when it is determined that the backup voltage data stored in the register section is below the threshold voltage data for recharge detection; that is, when it is determined that the charging voltage of the backup element has fallen to the recharge voltage.

In the present embodiment, threshold voltage data for detection of a drop in the backup power supply voltage may be stored in the register section as the threshold voltage data.

Once being stored in the register section, the threshold voltage data for voltage drop detection may be used to detect a drop in the backup power supply voltage.

In the present embodiment, the threshold voltage data may be multi-bit data.

This means that multiple values of the threshold voltage data can be represented by the multiple bits and can be stored in the register section for the sake of comparison with the backup voltage data obtained from the voltage detection circuit.

In the present embodiment, the voltage detection circuit may include a comparator circuit that compares the main power supply voltage with a threshold voltage for detection of a drop in the main power supply voltage. When the main power supply voltage falls below the threshold voltage for voltage drop detection, a power supply voltage that is to be supplied to internal circuitry of the circuit device may be switched from the main power supply voltage to the backup power supply voltage by the power supply control circuit.

That is, when the main power supply voltage decreases and falls below the threshold voltage for voltage drop detection, the internal circuitry of the circuit device may be cut off from the supply of the main power supply voltage and may be supplied with the backup power supply voltage by the backup element.

In the present embodiment, the circuit device may include an interface circuit for access to the register section.

When the interface circuit is included in the circuit device, a processing device or any other device external to the circuit device can access the register section through the interface circuit to write data into the register section or to read data from the register section.

In the present embodiment, the threshold voltage data may be provided to the register section through the interface circuit.

That is, multiple values of the threshold voltage data can be written into the register section through the interface circuit.

In the present embodiment, the backup voltage data detected by the voltage detection circuit may be stored in the register section, and the interface circuit may output the backup voltage data stored in the register section.

In this way, the backup voltage data detected by the voltage detection circuit can be output to the outside through the interface circuit.

In the present embodiment, the backup voltage data at a time specified through the interface circuit may be stored in the register section.

Thus, the backup voltage data at the time specified through the interface circuit can be read from the register section by an external processing device through the interface circuit.

In the present embodiment, the circuit device may include an interrupt generation circuit that generates an interrupt signal based on the result of the comparison of the backup voltage data and the threshold voltage data.

When a predetermined state is detected on the basis of the result of the comparison of the backup voltage data and the threshold voltage data, the interrupt signal is output to the outside from the interrupt generation circuit to indicate the detection of the predetermined state.

In the present embodiment, the voltage detection circuit may include a voltage sensor to which the backup power supply voltage is input as detection target voltage and from which the backup voltage data is output as voltage data. The voltage sensor may include: an oscillation circuit for voltage detection; and a current supply circuit that supplies the oscillation circuit for voltage detection with a supply current. The oscillation frequency of the oscillation circuit varies with the supply current. The amperage of the supply current varies with the detection target voltage. The voltage sensor may also include: a counter circuit that performs count processing; and an arithmetic circuit that performs arithmetic computations. The counter circuits performs, in a given period, the count processing on an output clock signal from the oscillation circuit for voltage detection. The arithmetic circuit performs the arithmetic computations to obtain the voltage data corresponding to the detection target voltage on the basis of a count value obtained in the count processing performed in a state in which the oscillation circuit for voltage detection is supplied with the supply current.

The voltage sensor including these circuits offers an advantage in that the accuracy of the detection of the detection target voltage can be adjusted in several ways. For example, the given period during which the count processing is performed may be set to an appropriate length, or the arithmetic computational algorithm for use in the arithmetic circuit may be changed.

A real-time clock device according to the present embodiment includes the circuit device described above and a resonator. The circuit device includes an oscillation circuit and a time measurement circuit. The oscillation circuit generates a clock signal by causing the resonator to oscillate. The time measurement circuit performs time measurement processing based on the clock signal.

The clock and calendar functions of real-time clocks can be achieved by the real-time clock device in which the time measurement circuit performs the time measurement processing based on the clock signal from the oscillation circuit. Furthermore, the real-time clock device according to the present embodiment can perform the charging control on the backup element for charging with the main power supply voltage by using the backup voltage data detected by the voltage detection circuit and the threshold voltage data stored in the register section.

Although the present embodiment has been described in detail so far, those skilled in the art would readily understand that various modifications may be made within the scope that does not substantially depart from the new features and effects described in the present disclosure. Thus, such variations are all included within the scope of the present disclosure. For instance, a term in any part of the present specification or the accompanying drawings can be paraphrased into another term having a wider or similar meaning and written along with the relevant term at least once in the present specification or in the drawings. All combinations of the present embodiment and the variations are also included in the scope of this disclosure. The configuration, operation, and so on of the circuit device are not limited to those described in the present embodiment and may be modified for implementation in various ways.

What is claimed is:

1. A circuit device comprising:
a main power supply terminal for receiving a main power supply voltage;
a backup power supply terminal for receiving a backup power supply voltage from a backup element;
a voltage detection circuit that detects the backup power supply voltage and outputs backup voltage data corresponding to the backup power supply voltage;
a register section storing threshold voltage data for comparison with the backup voltage data;
a processing circuit that compares the backup voltage data with the threshold voltage data; and
a power supply control circuit that performs charging control on the backup element for charging with the main power supply voltage based on a result of a comparison made by the processing circuit,
wherein the voltage detection circuit includes a voltage sensor to which the backup power supply voltage is input as detection target voltage and from which the backup voltage data is output as voltage data, and
the voltage sensor includes:
an oscillation circuit for voltage detection, an oscillation frequency of the oscillation circuit varying with a supply current;
a current supply circuit that supplies the oscillation circuit for voltage detection with the supply current, an amperage of the supply current varying with the detection target voltage;
a counter circuit that performs, in a given period, count processing on an output clock signal from the oscillation circuit for voltage detection; and
an arithmetic circuit that performs arithmetic computations to obtain the voltage data corresponding to the detection target voltage on the basis of a count value obtained in the count processing performed in a state in which the oscillation circuit for voltage detection is supplied with the supply current.

2. The circuit device according to claim 1, wherein threshold voltage data for full charge detection is stored in the register section as the threshold voltage data, and when the backup voltage data exceeds the threshold voltage data for full charge detection, the power supply control circuit performs control to stop charging the backup element with the main power supply voltage.

3. The circuit device according to claim 1, wherein threshold voltage data for recharge detection is stored in the register section as the threshold voltage data, and when the backup voltage data falls below the threshold voltage data for recharge detection, the power supply control circuit performs control to start charging the backup element with the main power supply voltage.

4. The circuit device according to claim 1, wherein threshold voltage data for detection of a drop in the backup power supply voltage is stored in the register section as the threshold voltage data.

5. The circuit device according to claim 1, wherein the threshold voltage data is multi-bit data.

6. The circuit device according to claim 1, wherein the voltage detection circuit includes a comparator circuit that compares the main power supply voltage with a threshold voltage for detection of a drop in the main power supply voltage, and when the main power supply voltage falls below the threshold voltage for voltage drop detection, a power supply voltage that is to be supplied to internal circuitry of the circuit device is switched from the main power supply voltage to the backup power supply voltage by the power supply control circuit.

7. The circuit device according to claim 1, further comprising an interface circuit for access to the register section.

8. The circuit device according to claim 7, wherein the threshold voltage data is provided to the register section through the interface circuit.

9. The circuit device according to claim 7, wherein the backup voltage data detected by the voltage detection circuit is stored in the register section, and the interface circuit outputs the backup voltage data stored in the register section.

10. The circuit device according to claim 9, wherein the backup voltage data at a time specified through the interface circuit is stored in the register section.

11. The circuit device according to claim 1, further comprising an interrupt generation circuit that generates an interrupt signal based on the result of the comparison of the backup voltage data and the threshold voltage data.

12. A real-time clock device comprising:
the circuit device according to claim 1; and
a resonator, wherein
the circuit device includes
the oscillation circuit that generates a clock signal by causing the resonator to oscillate, and
a time measurement circuit that performs time measurement processing based on the clock signal.

* * * * *